United States Patent
Lee (10) Patent No.: US 12,308,256 B2
(45) Date of Patent: May 20, 2025

(54) SUBSTRATE TREATMENT APPARATUS HAVING BOWL ASSEMBLY

(71) Applicant: DEVICEENG CO. LTD, Chungcheongnam-do (KR)

(72) Inventor: Taek Youb Lee, Chungcheongnam-do (KR)

(73) Assignee: DEVICEENG CO., LTD., Chungcheongnam-do (KR)

( * ) Notice: Subject to any disclaimer, the term of this patent is extended or adjusted under 35 U.S.C. 154(b) by 541 days.

(21) Appl. No.: 17/562,676

(22) Filed: Dec. 27, 2021

(65) Prior Publication Data

US 2023/0067103 A1    Mar. 2, 2023

(30) Foreign Application Priority Data

Aug. 24, 2021   (KR) ........................ 10-2021-0111357

(51) Int. Cl.
*H01L 21/67*      (2006.01)
*B08B 3/04*       (2006.01)
*H01L 21/687*     (2006.01)

(52) U.S. Cl.
CPC ........ *H01L 21/67051* (2013.01); *B08B 3/041* (2013.01); *H01L 21/68764* (2013.01)

(58) Field of Classification Search
CPC ......... H01L 21/67051; H01L 21/68764; H01L 21/67034; B08B 3/041; B08B 3/02
USPC ........................................................ 134/149
See application file for complete search history.

(56) References Cited

U.S. PATENT DOCUMENTS

| | | | | |
|---|---|---|---|---|
| 9,355,871 | B2* | 5/2016 | Higashijima | ........... B05B 14/00 |
| 9,953,848 | B2* | 4/2018 | Wakiyama | .......... H01L 21/6715 |
| 2004/0050491 | A1* | 3/2004 | Miya | ................. H01L 21/67051 156/345.11 |
| 2006/0046413 | A1* | 3/2006 | Edamoto | ........... H01L 21/67051 438/366 |
| 2006/0222315 | A1* | 10/2006 | Yoshida | ............ H01L 21/67051 385/147 |
| 2008/0078428 | A1* | 4/2008 | Yoshida | ............ H01L 21/67051 134/104.2 |
| 2008/0142051 | A1* | 6/2008 | Hashizume | ......... H01L 21/6708 134/23 |

(Continued)

FOREIGN PATENT DOCUMENTS

| | | | | |
|---|---|---|---|---|
| JP | 2004265910 A | * | 9/2004 | ....... H01L 21/67017 |
| JP | 4078163 B2 | * | 4/2008 | ............. B08B 17/00 |

(Continued)

OTHER PUBLICATIONS

Machine translation of KR-20180066951-A (Year: 2018).*
Machine translation of KR-20190060415-A (Year: 2019).*

*Primary Examiner* — David G Cormier
*Assistant Examiner* — Thomas Bucci
(74) *Attorney, Agent, or Firm* — Blank Rome LLP (57) ABSTRACT

The present invention relates to a substrate treatment apparatus including: a substrate support assembly having a spin head onto which a substrate is seated; a fluid supply unit for supplying a fluid to the substrate; a bowl assembly having a plurality of bowls overlaid one another outwardly in a radial direction thereof to surround the substrate support assembly; and an ascending and descending unit for moving up and down the bowl assembly, wherein the bowls constituting the bowl assembly move up and down independently of one another.

3 Claims, 8 Drawing Sheets

(56) References Cited

U.S. PATENT DOCUMENTS

| | | | |
|---|---|---|---|
| 2010/0032097 A1* | 2/2010 | Ohashi | H01L 21/67034 |
| | | | 156/345.55 |
| 2012/0180829 A1* | 7/2012 | Higashijima | B08B 3/041 |
| | | | 134/198 |
| 2012/0260946 A1* | 10/2012 | Ogata | H01L 21/67051 |
| | | | 134/33 |
| 2012/0312336 A1* | 12/2012 | Itoh | H01L 21/67748 |
| | | | 134/103.3 |
| 2013/0008872 A1* | 1/2013 | Higashuima | H01L 21/6715 |
| | | | 156/345.23 |
| 2013/0092195 A1* | 4/2013 | Takimoto | H01L 21/67276 |
| | | | 134/26 |
| 2014/0026927 A1* | 1/2014 | Ogata | H01L 21/67051 |
| | | | 134/104.2 |
| 2015/0040951 A1* | 2/2015 | Yoshizumi | H01L 21/67051 |
| | | | 134/95.1 |
| 2015/0114561 A1* | 4/2015 | Higashijima | H01L 21/6715 |
| | | | 156/345.23 |
| 2015/0187613 A1* | 7/2015 | Wakiyama | H01L 21/6715 |
| | | | 134/95.1 |
| 2017/0001223 A1 | 1/2017 | Lee | |
| 2017/0287743 A1* | 10/2017 | Kobayashi | H01L 21/02052 |
| 2017/0361364 A1* | 12/2017 | Ogata | B08B 13/00 |
| 2018/0025921 A1* | 1/2018 | Kabune | H01L 21/302 |
| | | | 438/754 |
| 2018/0334318 A1 | 11/2018 | Cho et al. | |
| 2019/0096720 A1* | 3/2019 | Naohara | G06T 7/001 |
| 2022/0005736 A1* | 1/2022 | Naohara | G06T 7/11 |
| 2022/0238346 A1* | 7/2022 | Hinode | H01L 21/67051 |

FOREIGN PATENT DOCUMENTS

| | | | | | |
|---|---|---|---|---|---|
| JP | 2015088598 A | * | 5/2015 | | H01L 21/6715 |
| KR | 20100052118 A | * | 5/2010 | | |
| KR | 20180066951 A | * | 6/2018 | | |
| KR | 20180066953 A | * | 6/2018 | | |
| KR | 20190060415 A | * | 6/2019 | | |
| KR | 20200121767 A | * | 10/2020 | | |

\* cited by examiner

Fig. 1

PRIOR ART

SUBSTRATE TREATMENT APPARATUS HAVING BOWL ASSEMBLY

CROSS REFERENCE TO RELATED APPLICATION OF THE INVENTION

The present application claims the benefit of Korean Patent Application No. 10-2021-0111357 filed in the Korean Intellectual Property Office on Aug. 24, 2021, the entire contents of which are incorporated herein by reference.

BACKGROUND OF THE INVENTION

Field of the Invention

The present invention relates to a substrate treatment apparatus having a bowl assembly, and more specifically, to a substrate treatment apparatus having a bowl assembly that is capable of being configured to have two or more bowls movable independently of each other.

Background of the Related Art

Generally, a semiconductor device is manufactured by depositing and patterning various materials on a substrate to the shape of thin films, and in the manufacturing process, different steps such as deposition, photolithography, etching, cleaning, and drying are needed.

Among them, the cleaning and drying processes are performed to remove foreign substances or particles from the substrate and to then dry the substrate. In a state where the substrate is supported on top of a spin head (chuck base), first, a treatment solution is supplied to top or underside of the substrate, while the spin head is rotating at a high speed.

Figure 1:
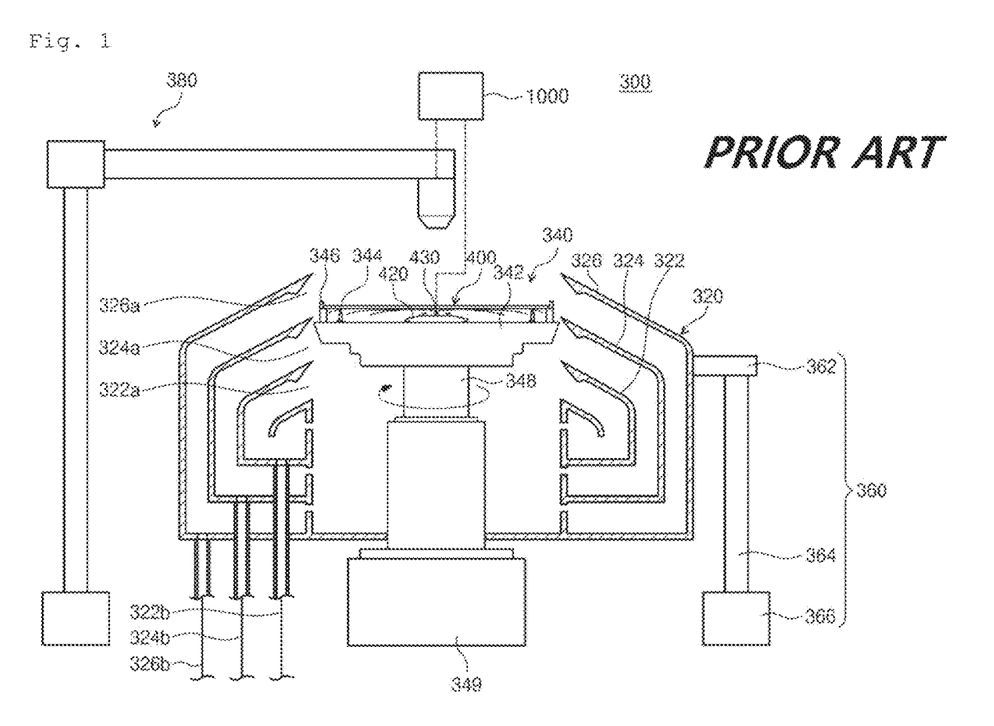
FIG. 1 is a side sectional view showing a conventional substrate treatment apparatus.

As shown in FIG. 1, a substrate treatment apparatus 300 generally includes a fluid supply unit 380, a bowl assembly 320, an ascending and descending unit 360, and a substrate support assembly 340 having a spin head 342.

The fluid supply unit 380 supplies chemical liquids or gases for treating a substrate W to the substrate W.

The substrate support assembly 340 serves to rotate the substrate W in a state of supporting the substrate W, while a given treatment is being carried out.

The bowl assembly 320 serves to receive chemical liquids used for treatments and fumes generated during the treatments to prevent the chemical liquids and fume from scattering or flowing to the outside and has a stacked structure of bowls so that different kinds of chemical liquids and fumes are separatedly introduced into passages formed by the bowls according to the passages of the bowls with respect to the substrate W.

The ascending and descending unit 360 serves to move up and down the substrate support assembly 340 or the bowl assembly 320 to change a relative height between the bowl assembly 320 and the substrate support assembly 340 within the bowl assembly 320.

Further, the conventional bowl assembly 320 includes an inner bowl, an intermediate bowl, and an outer bowl, which are spaced apart from one another at given intervals to form passages integrated with the bowls, but in this case, it is impossible to adjust the intervals between the adjacent passages.

As a result, if a rotating speed of the substrate support assembly 340 is varied, a fluid such as a chemical liquid or gas flowing to the passages collides against the surfaces of the bowls and rebounds, and besides, a portion of the fluid flows backward to undesirably cause the contamination of the substrate W.

SUMMARY OF THE INVENTION

Accordingly, the present invention has been made in view of the above-mentioned problems occurring in the related art, and it is an object of the present invention to provide a substrate treatment apparatus having a bowl assembly that is capable of allowing a plurality of bowls constituting the bowl assembly to have passages adjustable in width and to be defined to specific shapes, thereby preventing a chemical liquid or gas from rebounding and thus flowing backward toward a substrate.

To accomplish the above-mentioned objects, according to the present invention, there is provided a substrate treatment apparatus including: a substrate support assembly having a spin head adapted to seat a substrate thereonto; a fluid supply unit for supplying a fluid to the substrate; a bowl assembly having a plurality of bowls overlaid one another outwardly in a radial direction thereof to surround the substrate support assembly; and an ascending and descending unit for moving up and down the bowl assembly, wherein the bowls constituting the bowl assembly move up and down independently of one another.

According to the present invention, desirably, the bowls may include lower bowls, upper bowls slant inwardly in a radiation direction of the substrate support assembly, and connection bowls connecting top end peripheries of the lower bowls and underside end peripheries of the upper bowls and having curved inner peripheral surfaces with rounded longitudinal sectional shapes.

According to the present invention, desirably, when the bowl assembly is in a standby position, heights at which the curved inner peripheral surfaces of the connection bowls are started become gradually lowered toward the outer connection bowl from the inner connection bowl.

According to the present invention, desirably, the bowls may include horizontal passages formed on portions of the sections of the passages formed thereamong outwardly in the radial directions thereof from the inner peripheral surfaces of the upper bowls.

According to the present invention, desirably, among the passages of the bowls, the upper bowls have the slant passages gradually enlarged in width toward the connection bowls.

According to the present invention, desirably, in a longitudinal sectional view, the upper bowls have slant portions gradually increased in thickness toward the connection bowls.

According to the present invention, desirably, in a longitudinal sectional view, the upper bowls constituting the bowls have oval inner and outer shapes, and the connection bowls have the arch-shaped inner shapes.

According to the present invention, desirably, in a longitudinal sectional view, the upper bowls may include waveform-shaped protrusions protruding from the inner peripheral surfaces thereof and guide grooves formed concavely on both sides of the waveform-shaped protrusions.

According to the present invention, desirably, the connection bowls may include buffer grooves concaved more deeply than the inner peripheral surfaces of the lower bowls.

According to the present invention, desirably, the lower bowls and the connection bowls are detachably coupled to one another.

According to the present invention, desirably, between the lower bowls and the connection bowls are disposed adapters made of a resin to which carbon is added.

According to the present invention, desirably, the adapters are made of a fluorine resin-based material containing any one of carbon nanotubes, graphene, and carbon black as carbon-based components.

According to the present invention, desirably, the adapters and the top ends of the lower bowls are fixed to one another by means of fixing pins made of a resin.

According to the present invention, desirably, the connection bowls and the lower bowls may include first coupling grooves and first coupling protrusions formed on underside and top end peripheries thereof respectively, and the adapters may include second coupling protrusions and second coupling grooves formed on top and underside end peripheries thereof and coupled to the first coupling grooves and the first coupling protrusions respectively.

According to the present invention, desirably, the innermost bowl may include a first passage portion to which the fluid flows from the substrate and a second passage portion separated from the first passage portion through a partition wall, and the partition wall has an exhaust hole formed above the bottom of the first passage portion and slant upward from an inlet toward an outlet thereof.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Hereinafter, an embodiment of the present invention will be explained in detail with reference to the attached drawings.

Figure 2:
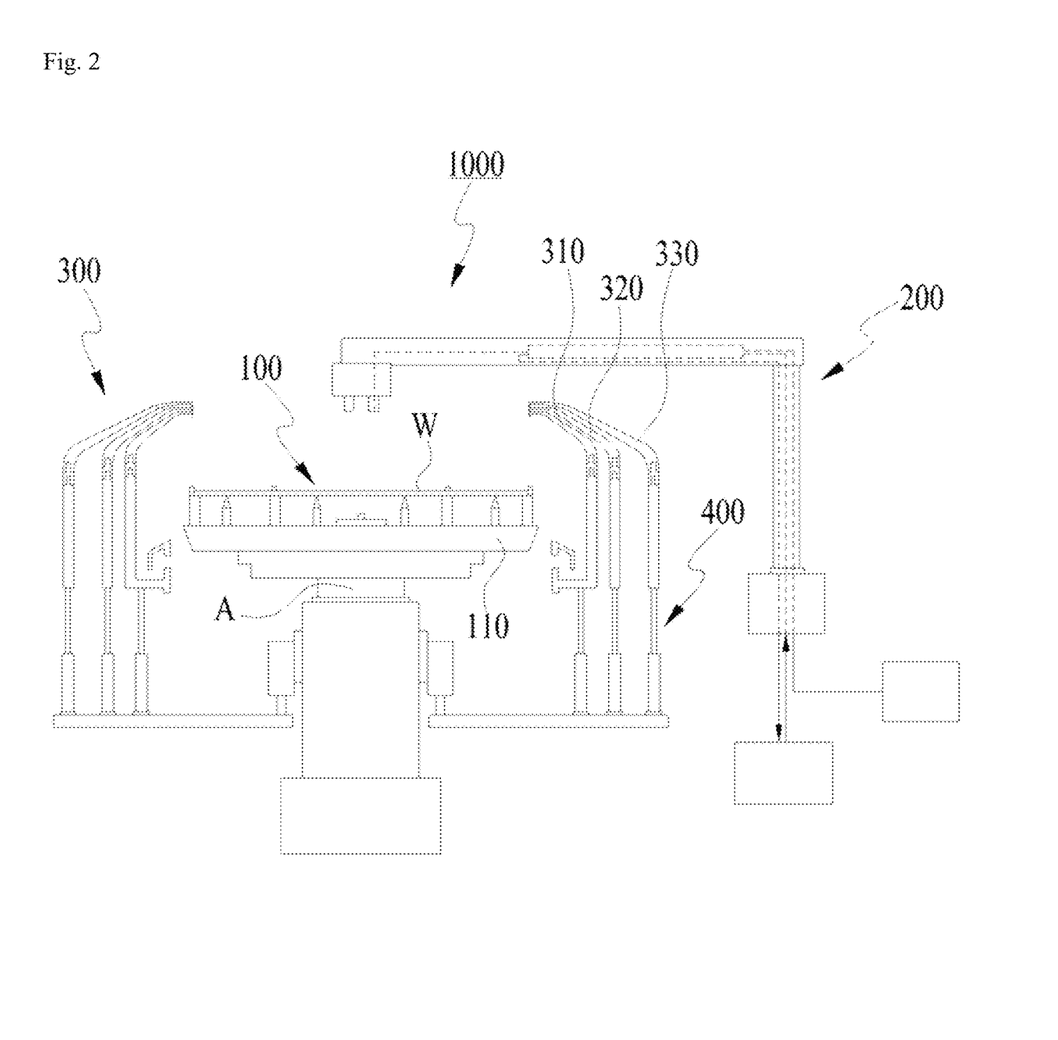
FIG. 2 is a side sectional view showing a substrate treatment apparatus according to the present invention.

As shown in FIG. 2, a substrate treatment apparatus 1000 according to the present invention includes a substrate support assembly 100 having a spin head 110 adapted to seat a substrate W thereonto, a fluid supply unit 200 for supplying a fluid such as a chemical liquid or gas to the substrate W, a bowl assembly 300 having a plurality of bowls 310, 320 and 330 overlaid one another outwardly in a radial direction thereof to surround the substrate support assembly 100, and an ascending and descending unit 400 for moving up and down the bowl assembly 300.

Figure 3:
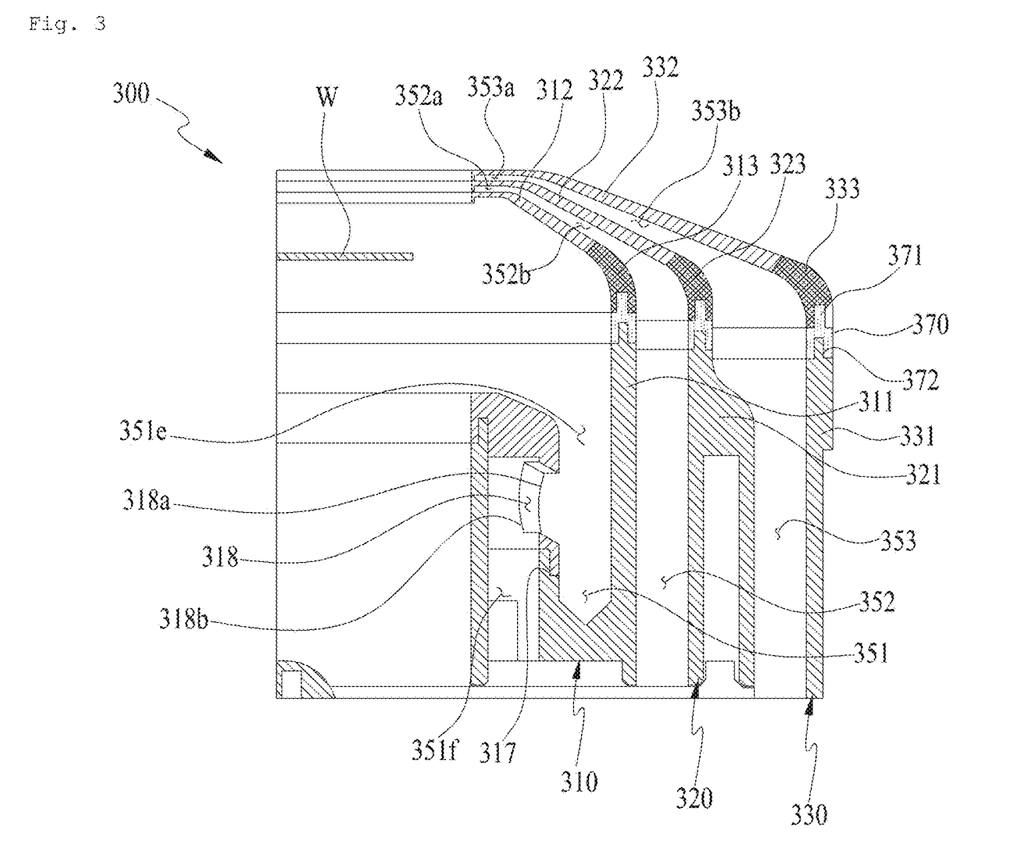
FIG. 3 is a longitudinal sectional view showing a bowl assembly in the substrate treatment apparatus according to the present invention.
Figure 4:
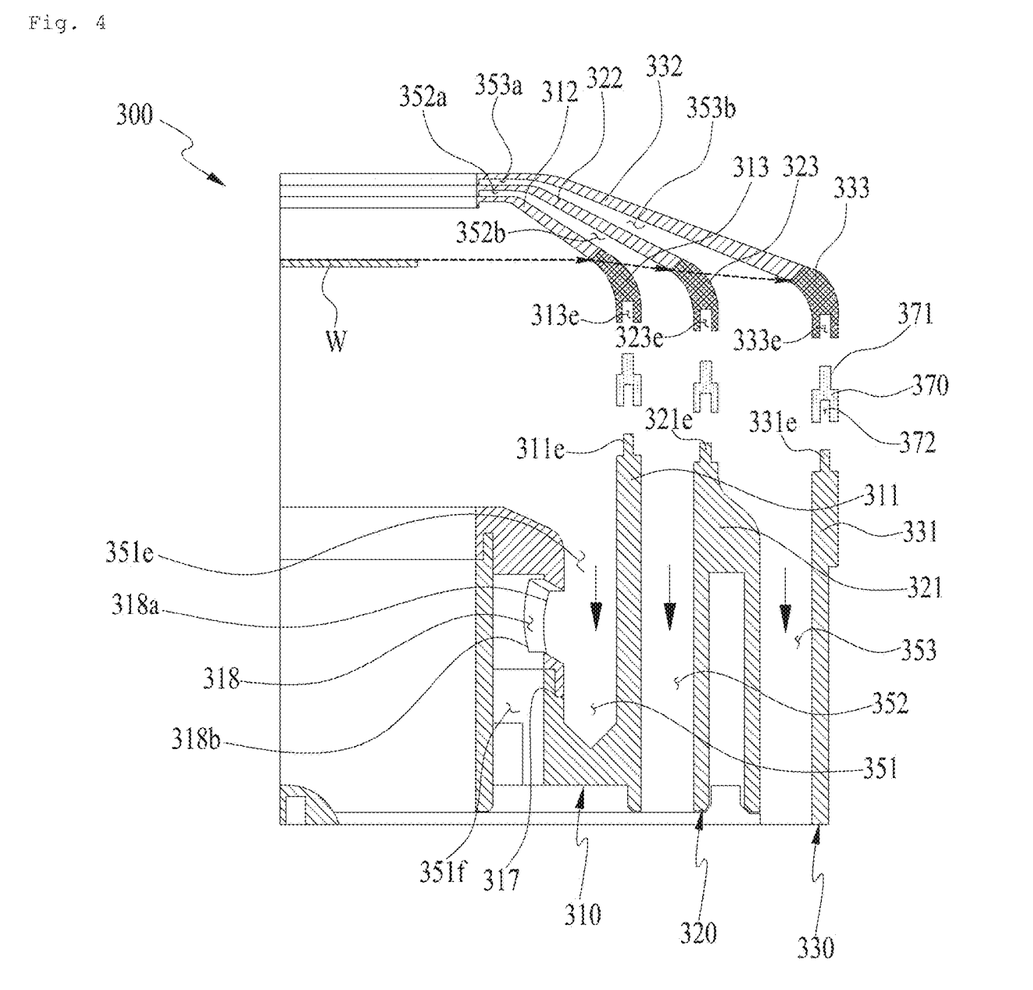
FIG. 4 is an exploded view showing the bowl assembly of FIG. 3.

In specific, as shown in FIGS. 3 and 4, the bowls 310, 320, and 330 constituting the bowl assembly 300 move up and down independently of one another, and accordingly, an intermediate passage 352 and an outer passage 353 among the bowls are appropriately adjusted in width according to given situations.

In the drawings, the bowl assembly 300 has three bowls 310, 320, and 330, but of course, the bowl assembly 300 may have two or four or more bowls according to situations or use purposes thereof.

The bowls 310, 320, and 330 include lower bowls 311, 321, and 331, upper bowls 312, 322, and 332 slant inwardly in a radiation direction of the substrate support assembly 100, and connection bowls 313, 323, and 333 connecting top end peripheries of the lower bowls 311, 321, and 331 and underside end peripheries of the upper bowls 312, 322, and 332 and having curved inner peripheral surfaces with rounded longitudinal sectional shapes.

Accordingly, the fluid entering the passages of the bowls 310, 320, and 330 themselves or the passages formed among the bowls 310, 320, and 330 through the centrifugal force of the substrate W can be prevented from rebounding and thus flowing backward to the substrate W to the maximum extent possible.

The upper bowls 312, 322, and 332, the lower bowls 311, 321, and 331, and the connection bowls 313, 323, and 333 are formed integrally with one another, and otherwise, the lower bowls 311, 321, and 331 and the connection bowls 313, 323, and 333 are detachably coupled to one another.

When the bowl assembly 300 is in a standby position, as shown in FIG. 4, heights at which the curved inner peripheral surfaces of the connection bowls 313, 323, and 333 are started become gradually lowered toward the outer connection bowl 333 from the inner connection bowl 313.

In this case, the standby position of the bowl assembly 300 means that the bowls 310, 320, and 330 are collected adjacent to one another to thus stay at their uppermost position above the substrate W in a state where the substrate W is supported against the substrate support assembly 100.

In this case, the bowl assembly 300 has a stacked structure from the inside thereof outwardly so that the inner bowl is surrounded by the intermediate bowl and the intermediate bowl by the outer bowl.

Accordingly, an inner passage 351, the intermediate passage 352, and the outer passage 353 are formed according to moving paths of the fluid through the centrifugal force of the substrate W, and collision points of droplets of the fluid are almost collected to the curved peripheral surfaces of the connection bowls 313, 323, and 333, so that when the fluid enters the passages 351, 352, and 353 formed by the bowls 310, 320, and 330, the droplets naturally move downward, without any rebounding.

In more specific, when viewed on a front, the fluid dispersing from the rotating substrate W moves in a radial direction and then moves down by means of its own weight, and accordingly, the moving path of the fluid has an approximately curved shape such as a parabola.

As the fluid becomes distant from the center of the substrate W, that is, it becomes lowered in position along the curved moving path thereof, and if the passages in the bowl assembly 300 are formed along the curved moving paths, the fluid can be suppressed from rebounding due to its early collision.

When the bowl assembly 300 is in the standby position, if the heights at which the curved inner peripheral surfaces of the connection bowls 313, 323, and 333 are started become gradually lowered toward the outer bowl 330 from the inner bowl 310, the passages can be formed along the curved moving paths of the fluid to the maximum extents, so that the backflow of the fluid caused by rebounding can be prevented.

Figure 5A:
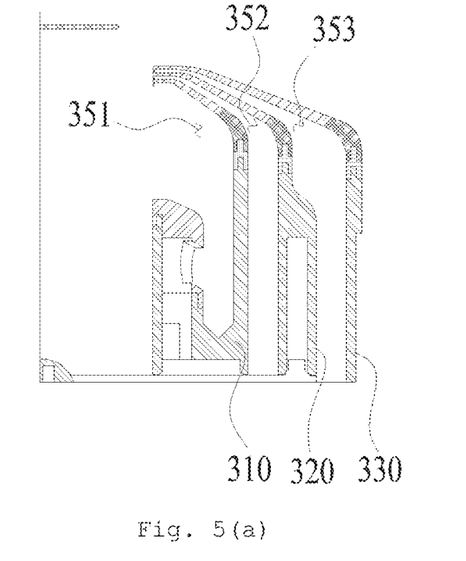
FIGS. 5A to 5D are longitudinal sectional views showing operating examples of the bowl assembly in the substrate treatment apparatus according to the present invention.

As shown in FIG. 5A, the standby position of the bowl assembly 300 means that all of the bowls 310, 320, and 330 are in their lowermost standby position, and in this case, top of the substrate support assembly 100 is placed higher than tops of the bowls 310, 320, and 330 to exchange the substrate W with new one.

In the case where the bowl assembly 300 is really used, the respective bowls move to given heights with respect to the substrate W from their standby position, thereby providing the passages required.

Figure 5B:
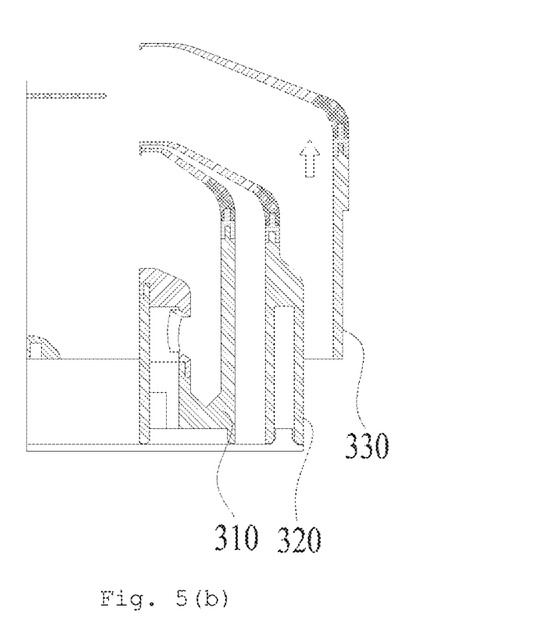
Figure 5C:
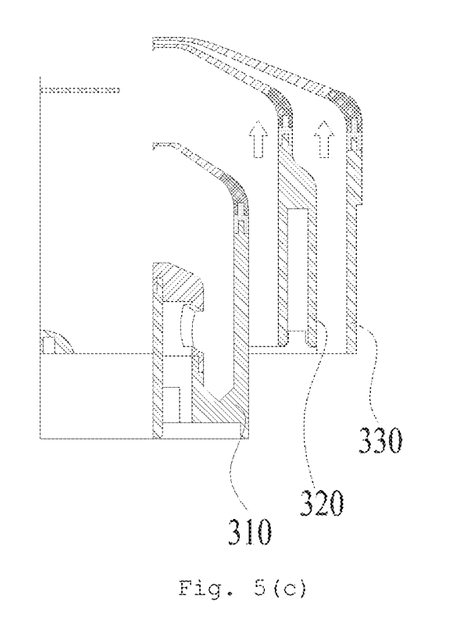
Figure 5D:
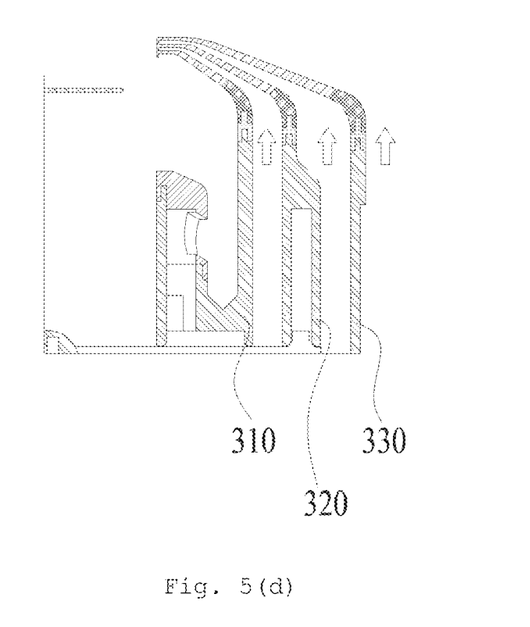

According to the present invention, as shown in FIG. 5B, if it is desired to use a first passage formed in the outer side of the bowl assembly 300, only the outer bowl 330 moves up, and as shown in FIG. 5C, if it is desired to use a second passage formed in the intermediate portion of the bowl assembly 300, the intermediate bowl 320 and the outer bowl 330 simultaneously move up. Further, as shown in FIG. 5D, if it is desired to use a third passage formed in the inner side of the bowl assembly 300, all of the three bowls move up.

Figure 6:
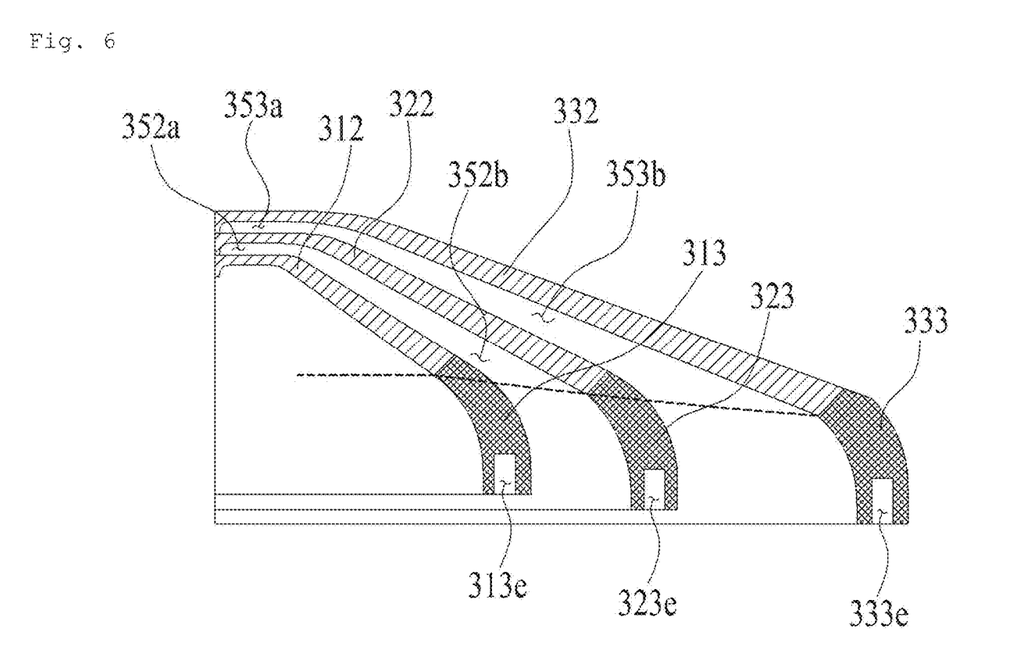
FIG. 6 is a longitudinal sectional view showing upper bowls of FIG. 3.

Further, as shown in FIG. 6, the bowls 310, 320, and 330 include horizontal passages 352*a* and 353*a* formed on portions of the sections of the passages 352 and 353 formed thereamong outwardly in the radial directions thereof from the inner peripheral surfaces of the upper bowls 312, 322, and 332, that is, on the sections closest to the substrate W, and accordingly, the fluid introduced from the substrate W easily enters the horizontal passages 352*a* and 353*a*, without any collision.

As slant passages 352*b* and 353*b* of the upper bowls 312, 322, and 332 among the passages of the bowls 310, 320, and 330 become gradually enlarged in width toward the connection bowls 313, 323, and 333, the fluid entering the horizontal passages 352*a* and 353*a* just moves downward along the curved peripheral surfaces of the connection bowls 313, 323, and 333, without any collision against the slant passages 352*b* and 353*b* to the maximum extent possible.

In a longitudinal sectional view, in specific, the upper bowls 312, 322, and 332 have slant portions gradually increased in thickness toward the connection bowls 313, 323, and 333, and even though big differences among the inclinations of the upper bowls 312, 322, and 332 are not set, the slant passages 352*b* and 353*b* may be enlarged in width toward their lower portions. As a result, big differences among the diameters of the lower bowls 311, 321, and 331 are not made, and areas occupied by the lower bowls 311, 321, and 331 on the plane can be greatly reduced, so that the bowl assembly 300 can be compacted in structure and achieve a high structural strength on the lower end thereof.

Figure 7:
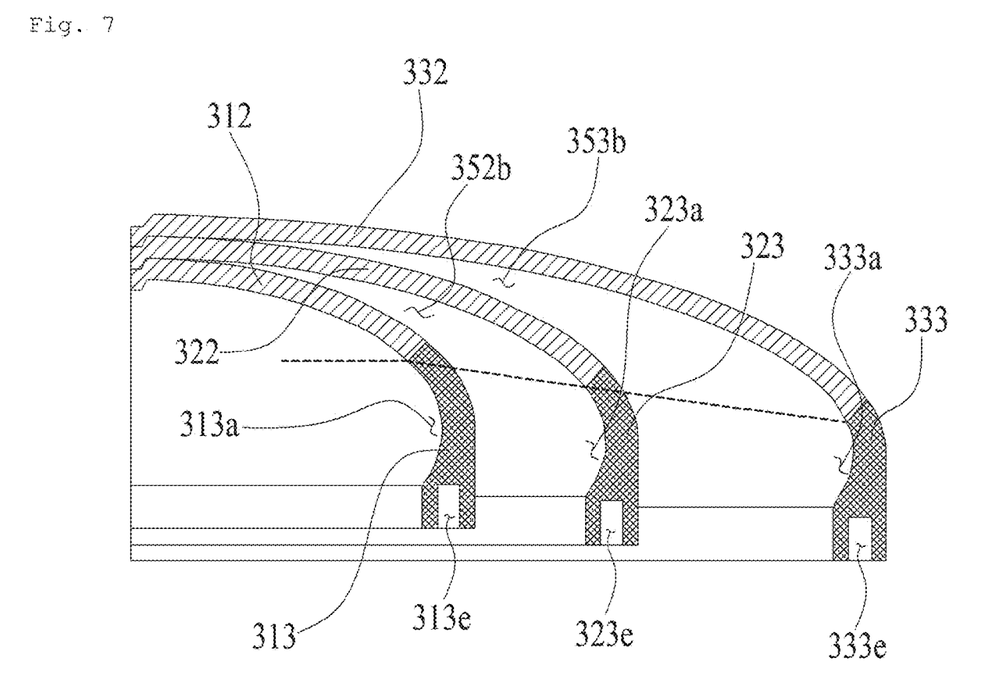
FIG. 7 is a longitudinal sectional view showing another example of the upper bowls in the substrate support assembly according to the present invention.
Figure 8:
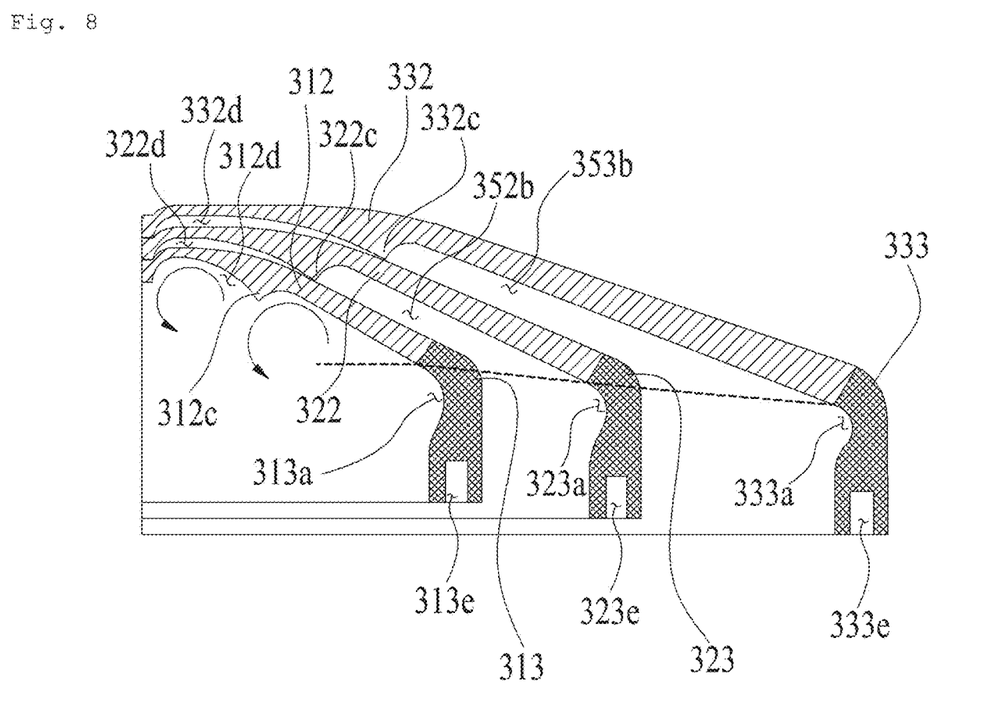
FIG. 8 is a longitudinal sectional view showing yet another example of the upper bowls in the substrate support assembly according to the present invention.

Further, as shown in FIGS. 7 and 8, the connection bowls 313, 323, and 333 include buffer grooves 313*a*, 323*a*, and 333*a* concaved more deeply than the inner peripheral surfaces of the lower bowls 311, 321, and 331 outwardly, and accordingly, the droplets reach the buffer grooves 313*a*, 323*a*, and 333*a* formed more deeply than the inner peripheral walls of the lower bowls 311, 321, and 331, temporarily stay thereon, and naturally slide and move downward, so that desirably, the backflow of the fluid caused by rebounding can be prevented more reliably.

In this case, as shown in FIG. 7, in a longitudinal sectional view, the upper bowls 312, 322, and 332 constituting the bowls 310, 320, and 330 include oval inner and outer shapes, and the connection bowls 313, 323, and 333 have arch-shaped inner shapes to strengthen the functions of buffers (allowing the droplets to temporarily stay thereon) of forming internal air flows, so that the droplets entering the passages among the bowls naturally slide and move downward along the passages, without any rebounding.

When the bowl assembly 300 is in the standby position, in this case, heights at which the curved inner peripheral surfaces (the arch-shaped sections) of the connection bowls 313, 323, and 333 are started desirably become gradually lowered toward the outer connection bowl 333 from the inner connection bowl 313.

Further, as shown in FIG. 8, in a longitudinal sectional view, the upper bowls 312, 322, and 332 include one or more waveform-shaped protrusions 312*c*, 322*c*, and 332*c* protruding from the inner peripheral surfaces thereof and guide grooves 312*d*, 322*d*, and 332*d* formed concavely on both sides of the respective waveform-shaped protrusions 312*c*, 322*c*, and 332*c*, and when a vortex from the fluid flowing into the passages 351, 352, and 353 occurs in a clockwise direction, an air flow occurs in a counterclockwise direction through the waveform-shaped protrusions 312*c*, 322*c*, and 332*c* and the guide grooves 312*d*, 322*d*, and 332*d* and is thus offset by the vortex, so that the backflow of the droplets can be reliably prevented from occurring due to the vortex.

In this case, when the bowl assembly 300 is in the standby position, heights at which the curved inner peripheral surfaces of the connection bowls 313, 323, and 333 are started desirably become gradually lowered toward the outer connection bowl 333 from the inner connection bowl 313.

Further, as shown in FIGS. 3 and 4, the inner bowl 310 includes a first passage portion 351*e* to which the fluid flows from the substrate W and a second passage portion 351*f* separated from the first passage portion 351*e* through a partition wall 317, and the partition wall 317 has an exhaust hole 318 formed above the bottom of the first passage portion 351*e* and slant upward from an inlet 318*a* toward an outlet 318*b* thereof.

Accordingly, the liquid components of the fluid are introduced through the first passage portion 351*e*, and the gaseous components thereof are exhausted through the exhaust hole 318 and the second passage portion 351*f*. In this case, when some of the liquid components are mixed with the gas passing through the exhaust hole 318, the liquid components are changed to the droplets on the keen top end portion of the exhaust hole 318, move downward, and are then discharged to the first passage portion 351*e*.

Further, the lower bowls 311, 321, and 331 and the connection bowls 313, 323, and 333 are detachably coupled to one another, and in specific, in the state where the lower bowls 311, 321, and 331 are set as common components, the upper bowls 312, 322, and 332 and the connection bowls 313, 323, and 333 are exchanged with new ones, so that desirably, an appropriate bowl structure can be freely selected according to conditions and situations.

In this case, adapters 370, which are made of a resin to which carbon is added, are disposed between the lower bowls 311, 321, and 331 and the connection bowls 313, 323, and 333, to provide absorbing effects and to prevent the bowls from being charged by an electrostatic force to thus have no bad influences on the cleaning of the substrate W.

The adapters 370 may be made of a fluorine resin-based material containing carbon-based components such as carbon nanotubes, graphene, carbon black, and the like.

The adapters 370 and the top ends of the lower bowls 311, 321, and 331 are fixed to one another by means of fixing pins (not shown) made of a resin, and in this case, the fixing pins are made of the same material as the adapters 370 or made of a fluorine resin or a plastic with a chemical resistance.

The connection bowls 313, 323, and 333 include first coupling grooves 313e, 323e, and 333e formed on the underside end peripheries thereof, and the lower bowls 311, 321, and 331 include first coupling protrusions 311e, 321e, and 331e formed on the top end peripheries thereof respectively. Further, the adapters 370 include second coupling protrusions 371 and second coupling grooves 372 formed on top and underside end peripheries thereof and thus coupled to the first coupling grooves 313e, 323e, and 333e and the first coupling protrusions 311e, 321e, and 331e.

As described above, the substrate treatment apparatus according to the present invention is configured to have the substrate support assembly having the spin head adapted to seat the substrate thereonto, the fluid supply unit for supplying a fluid such as a chemical liquid or gas to the substrate, the bowl assembly having the plurality of bowls overlaid one another outwardly in the radial direction thereof to surround the substrate support assembly, and the ascending and descending unit for moving up and down the bowl assembly, wherein the bowls constituting the bowl assembly move up and down independently of one another to allow the passages formed thereamong to be appropriately adjusted in width according to given situations.

According to the present invention, further, the bowls include the lower bowls, the upper bowls slant inwardly in the radiation direction of the substrate support assembly, and the connection bowls connecting top end peripheries of the lower bowls and underside end peripheries of the upper bowls and having the curved inner peripheral surfaces with rounded longitudinal sectional shapes, so that the fluid entering the passages of the bowls themselves or the passages among the bowls through the centrifugal force of the substrate can be prevented from rebounding and thus flowing backward to the substrate.

According to the present invention, moreover, when the bowl assembly is in a standby position, the heights at which the curved inner peripheral surfaces of the connection bowls are started become gradually lowered toward the outer connection bowl from the inner connection bowl, so that when the fluid such as the chemical liquid or gas supplied to the substrate enters the passages formed by the bowls, the droplets naturally move downward, without any rebounding.

According to the present invention, also, the bowls include the horizontal passages formed on portions of the sections of the passages formed thereamong outwardly in the radial directions thereof from the inner peripheral surfaces of the upper bowls, that is, on the sections closest to the substrate, and accordingly, the fluid introduced from the substrate easily enters the horizontal passages, without any collision.

According to the present invention, in addition, as the slant passages of the upper bowls among the passages of the bowls become gradually enlarged in width toward the connection bowls, the fluid entering the horizontal passages just moves downward along the curved peripheral surfaces of the connection bowls, without any collision against the intermediate passages to the maximum extent possible.

According to the present invention, further, in a longitudinal sectional view, the upper bowls have the slant portions gradually increased in thickness toward the connection bowls, and even though big differences among the inclinations of the upper bowls are not set, the slant passages may become enlarged in width toward their lower portions, so that big differences among the diameters of the lower bowls cannot be made, areas occupied by the lower bowls on the plane can be greatly reduced, and the bowl assembly can become compact in structure.

According to the present invention, moreover, the connection bowls include the buffer grooves concaved more deeply than the inner peripheral surfaces of the lower bowls outwardly, and accordingly, the droplets reach the buffer grooves formed more deeply than the inner peripheral walls of the lower bowls, temporarily stay thereon, and naturally slide and move downward, so that desirably, the backflow of the fluid caused by the rebounding can be prevented more reliably.

According to the present invention, also, in a longitudinal sectional view, the upper bowls constituting the bowls have the oval inner and outer shapes, and the connection bowls have the arch-shaped inner shapes to strengthen the functions of the buffers of forming internal air flows, so that the droplets entering the passages among the bowls can naturally slide and move downward along the passages, without any rebounding.

According to the present invention, additionally, in a longitudinal sectional view, the upper bowls include one or more waveform-shaped protrusions protruding from the inner peripheral surfaces thereof and the guide grooves formed concavely on both sides of the waveform-shaped protrusions, so that when a vortex from the fluid flowing into the passages occurs in a clockwise direction, an air flow occurs in a counterclockwise direction through the waveform-shaped protrusions and the guide grooves and is thus offset by the vortex, thereby preventing the backflow of the droplets from occurring due to the vortex.

According to the present invention, further, the lower bowls and the connection bowls are detachably coupled to one another, and in specific, in the state where the lower bowls are set as common components, the upper bowls and the connection bowls are exchanged with new ones, so that desirably, an appropriate bowl structure can be freely selected according to conditions and situations, thereby greatly improving the productivity thereof.

According to the present invention, besides, the adapters, which are made of a resin to which carbon is added, are disposed between the lower bowls and the connection bowls to prevent the bowls from being charged by an electrostatic force to thus have no bad influences on the cleaning of the substrate.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A substrate treatment apparatus comprising:
a substrate support assembly having a spin head onto which a substrate is seated;
a fluid supply unit for supplying a fluid to the substrate;
a bowl assembly having a plurality of bowls overlaid one another outwardly in a radial direction thereof to surround the substrate support assembly; and
an ascending and descending unit for moving up and down the bowl assembly,
wherein the bowls constituting the bowl assembly move up and down independently of one another,
wherein the bowls comprise:
lower bowls;

upper bowls slant inwardly in a radial direction of the substrate support assembly; and connection bowls connecting top end peripheries of the lower bowls and underside end peripheries of the upper bowls via adapters and having curved inner peripheral surfaces with rounded longitudinal sectional shapes, wherein between the lower bowls and the connection bowls are disposed adapters made of a resin, the adapters being made of a fluorine resin-based material containing any one of carbon nanotubes, graphene, and carbon black as carbon-based components, so as to prevent the bowls from being charged by an electrostatic force, wherein the connection bowls and the lower bowls comprise first coupling grooves and first coupling protrusions formed on underside and top end peripheries thereof respectively, and the adapters comprise second coupling protrusions and second coupling grooves formed on top and underside end peripheries thereof and thus coupled to the first coupling grooves and the first coupling protrusions respectively, wherein the innermost bowl of the bowls comprises a first passage portion to which the fluid flows from the substrate and a second passage portion separated from the first passage portion through a partition wall, and the partition wall has an exhaust hole formed above the bottom of the first passage portion and slanting upward from an inlet toward an outlet thereof.

2. The substrate treatment apparatus according to claim 1, wherein in a longitudinal sectional view, the upper bowls comprise waveform-shaped protrusions protruding from the inner peripheral surfaces thereof and guide grooves formed concavely on both sides of the waveform-shaped protrusions.

3. The substrate treatment apparatus according to claim 1, wherein the adapters and the top ends of the lower bowls are fixed to one another by means of fixing pins made of a resin.

* * * * *